United States Patent [19]

Epstein

[11] Patent Number: 5,013,910

[45] Date of Patent: May 7, 1991

[54] SHAFT ANGLE ENCODER WITH A SYMMETRICAL CODE WHEEL

[75] Inventor: Howard C. Epstein, Los Altos, Calif.

[73] Assignee: Hewlett-Packard Company, Palo Alto, Calif.

[21] Appl. No.: 422,111

[22] Filed: Oct. 16, 1989

[51] Int. Cl.⁵ .............................................. G01D 5/34
[52] U.S. Cl. .......................... 250/231.17; 250/237 G; 341/13
[58] Field of Search ...................... 250/231.14, 231.17, 250/237 G; 341/13; 356/375, 395, 396

[56] References Cited

U.S. PATENT DOCUMENTS

| | | | |
|---|---|---|---|
| 4,259,570 | 3/1981 | Leonard | 250/231 SE |
| 4,266,125 | 5/1981 | Epstein et al. | 250/237 G |
| 4,451,731 | 5/1984 | Leonard | 250/231 SE |
| 4,604,521 | 8/1986 | Takekoshi et al. | 250/231.17 |
| 4,691,101 | 9/1987 | Leonard | 250/231 SE |

*Primary Examiner*—David C. Nelms

[57] ABSTRACT

A shaft angle encoder is provided with a symmetrical code wheel and pattern of photodetectors for providing an index pulse indicative of shaft angular position. The code wheel has two concentric index tracks each of which is symmetrical in a circumferential direction and are symmetrical with respect to each other and also with respect to a data track for indicating increments of angular position. In an exemplary embodiment there is a pair of windows of unit width in the one index track with a spoke therebetween with a width of at least two units. A pair of lateral windows extend away from each other more than a unit width along the second track. An opaque area at least two units wide is provided between the lateral windows in the second track. The photodetectors are arranged so that when the code wheel is in the index pulse position, a pair of photodetectors for the inner track are illuminated through the windows in the inner track, and two photodetectors for the outer track are both occulted by the opaque area between the lateral windows in the second track. Such an arrangement provides symmetry of the code wheel so that it can be inverted either accidentally or intentionally during assembly and yet side lobes of photocurrent from the photodetectors on the separate tracks are not coincident, thereby avoiding false index pulse triggers.

24 Claims, 4 Drawing Sheets

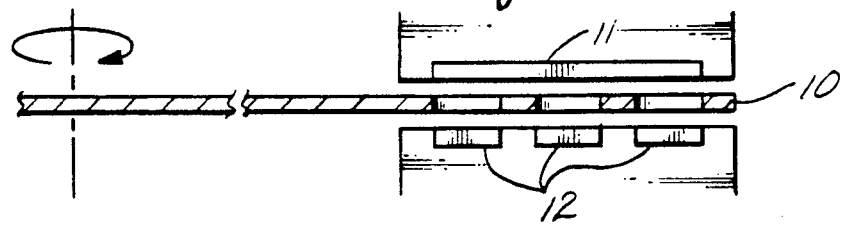
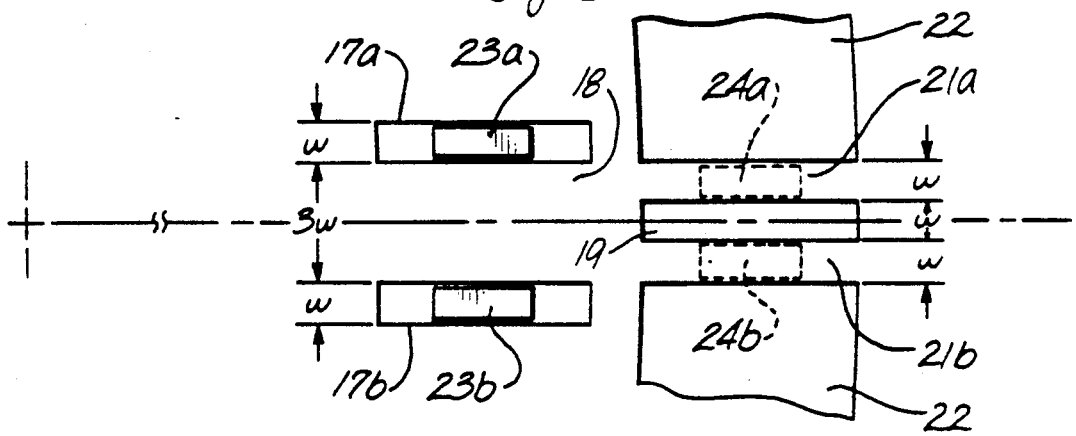
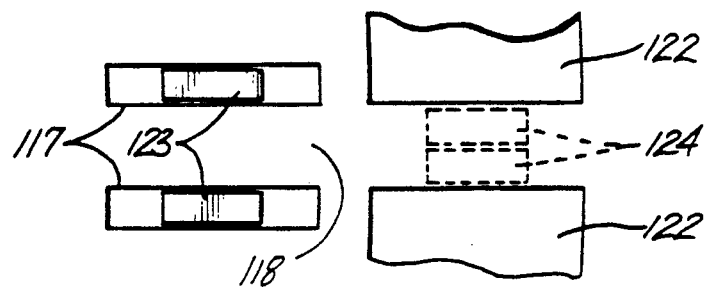

SHAFT ANGLE ENCODER WITH A SYMMETRICAL CODE WHEEL

BACKGROUND OF THE INVENTION

This invention relates to an optical shaft angle encoder which produces electrical signals indicative of the angular position of a shaft. In particular, it relates to a symmetrical arrangement of photodetectors, and windows and spokes in a code wheel for reliably producing an index pulse to indicate one angular position of the shaft.

Incremental shaft angle encoders are used to resolve the position and movement of a code wheel which rotates with a shaft. Such encoders include a light source for emitting a light beam, an array of transparent windows and opaque spokes on the code wheel for modulating the light beam in response to rotation of the wheel, and a detector assembly for receiving modulated light in producing electrical signals indicating the amount of light received by the photodetectors.

For a shaft angle encoder to produce an indication of the absolute position or location of the code wheel as it rotates, an index pulse is generated at least once per revolution of the code wheel. The incremental signals from a data track on the code wheel are used to count incremental movement from the index pulse for determining the absolute angular position of the code wheel at any place along its rotation. Thus, such a shaft angle encoder includes at least two channels of information. One of the information channels comprises an index signal produced at least once during a revolution at a known angular position and a data signal indicating incremental changes from the known position.

Shaft angle encoders are described, for example, in U.S. Pat. Nos. 4,259,570, 4,266,125, 4,451,731, and 4,691,101, the subject matter of which is hereby incorporated by reference.

A high degree of resolution and accuracy may be needed in such a shaft angle encoder. It is not unusual to specify a resolution of 2000 increments per revolution of the shaft. To achieve such a resolution, the windows through the code wheel through which light passes in the area of the photodetectors must be narrow. As a consequence, the amount of illumination and signal strength from the photodetectors tends to be low. To achieve a suitable signal strength, two or three windows and corresponding photodetectors may be used for each track to obtain adequate signal strength while keeping the index pulse width narrow.

In an exemplary embodiment, the code wheel has 500 transparent windows and an equal number of opaque spokes between the windows in the data track. These windows and spokes have a trapezoidal shape since they are located immediately adjacent to one another on the circular track. An exemplary nominal width of each window and spoke is 62 microns and the radial length of each window is about 750 microns. The code wheel is made of an optically opaque material such as stainless steel and has a diameter of approximately 22 millimeters. The windows are holes masked and etched through the disk. The dimensions of the windows and photodetectors for obtaining an index pulse are comparable. Such numerical values are merely exemplary.

With such very small dimensions, careful alignment of the parts of the shaft angle encoder becomes of appreciable importance. As a way of alleviating some of the alignment stringency, a technique has been developed for obtaining index pulses using two tracks. In such an arrangement, one index track is radially inward of the data track and the other is radially outward from the data track. Thus, the centroid of the two index tracks is at the same radial distance from the shaft as the data track.

Photodetectors are arranged for these index tracks so that when one set of photodetectors is illuminated when the code wheel is in its index position, the other set of photodetectors is occulted.

A push-pull electronic arrangement is then used for determining the location of the index pulse. In such an arrangement, when one of the tracks, such as the outer track, has greater illumination of the photodetectors, there is a logic signal of one sense, such as a logical 1. When the illumination on the inner track becomes greater than that of the output track, there is the opposite sense of logic signal, such as a logical 0, which forms the index pulse.

The windows and photodetectors are arranged so that in only one position does the illumination of the inner track exceed the illumination of the outer track. This is accomplished by having the photodetectors for the inner track aligned with windows in that position, and the photodetectors for the outer track being aligned with opaque spokes.

In previous arrangements for generating such index pulses where there are multiple windows for greater signal strength, the windows have been located asymmetrically in a radial or circumferential direction for minimizing what are referred to as side lobes relative to the index pulse.

Assume there are two windows in a track. When both windows are over photodetectors there is a photodetector current with a magnitude of two. As the code wheel continues to rotate, one of the windows passes over a second photodetector while the other photodetector remains dark. This produces a side lobe photocurrent signal having a magnitude of one. The asymmetrical arrangement of windows extending around an index track tends to minimize the magnitude of the side lobe signals relative to the index signal.

Some code wheels have been made with symmetrical index tracks, but the index tracks are offset in a circumferential direction from symmetry with the data track. This has been done so that phase differences may be used for determining the direction of rotation of the code wheel.

Situations have arisen where it is desirable to have a completely symmetrical code wheel. This occurs, for example, where it is desirable to switch the photodetectors and light source to opposite faces of the wheel; that is, turn the wheel over. When an asymmetrical code wheel is used, appreciable care must be taken to assure that the wheel orientation is correct. Incorrect assembly with the wheel upside down can make proper operation of the encoder impossible.

It is desirable to have a completely symmetrical code wheel so that this potential error in assembly can be avoided and assembly operations thereby expedited. A symmetrical code wheel also eliminates the occasional errors that may occur during the best of assembly operations, either during original manufacture or in subsequent reassembly.

BRIEF SUMMARY OF THE INVENTION

There is, therefore, provided in practice of this invention according to a presently preferred embodiment, a symmetrical code wheel for a shaft angle encoder. The code wheel has a circumferential data track with a plurality of alternating windows and spokes. A pair of index tracks are provided concentric with the data track. In one of these tracks, there is a pair of windows of unit width with a spoke between the windows having a width of at least two units. In the second track, there is a pair of windows in the same radial sectors as the windows in the first track and extending more than one unit width along the track away from each other, and an opaque area at least two units wide between the windows.

Preferably for minimum index pulse width, the pair of windows in the first track are three units apart from each other and the opaque area in the second track comprises two one unit wide spokes with a one unit wide central window between the spokes. An equivalent effect can be obtained where the window areas are opaque and the spoke areas transparent in the same relative positions as the windows and spokes just mentioned.

A pattern of photodetectors corresponding to such a pattern of windows and spokes is used in the shaft angle encoder. The photodetectors for the first track are arranged in the same position as the windows and the photodetectors in the second track are arranged in the same position as the spokes. Such a shaft angle encoder has an arrangement of windows causes side lobes of photocurrent from the two index tracks to be offset from each other and minimizes false triggers of an index pulse.

BRIEF DESCRIPTION OF THE DRAWINGS

These and other features and advantages of the present invention will be appreciated as the same becomes better understood by reference to the following detailed description when considered in conjunction with the accompanying drawings wherein:

FIG. 1 is a schematic fragmentary cross section of a shaft angle encoder;

FIG. 3 is a schematic illustration of the index tracks of the embodiment of shaft angle encoder illustrated in FIG. 2;

FIG. 5 indicates in a fragmentary schematic face view of a code wheel, another embodiment of shaft angle encoder;

DETAILED DESCRIPTION

A shaft angle encoder has a code wheel 10 mounted on a shaft (not shown) for rotation between a light source 11 and a suitable array of photodetectors 12 for measuring light intensity transmitted through the code wheel. The structures are illustrated schematically herein since details of construction and assembly are largely immaterial and are well-known to those skilled in the art. Also, instead of illuminating the photodetectors directly following the code wheel, there could be a conventional phase plate in between.

It will also be apparent as the disclosure is considered that the invention is not limited to an angle encoder. It is also applicable for a position encoder where there is a linear track rather than a circular track. For that matter, a linear track could be considered as a limiting case of a circular track with an infinite radius. It is, however, convenient for purposes of the specification and claims of this application to refer to the invention in the context of an angle encoder.

The light source may, for example, comprise one or more solid state light emitters such as an LED selected for a desired wavelength of radiation. A lens may be used for collimating light from the source for illuminating one face of the code wheel. Typically, the photodetectors are formed as areas on an integrated circuit chip including other electronic components for processing the signals from the photodetectors. The code wheel may be made of an opaque material with openings for windows or of a transparent material metallized or otherwise coated to make selected areas opaque. Alternatively, the invention may employ a code wheel with reflective and non-reflective areas, with the light source and light detectors adjacent to the same face of the code wheel.

Figure 2:
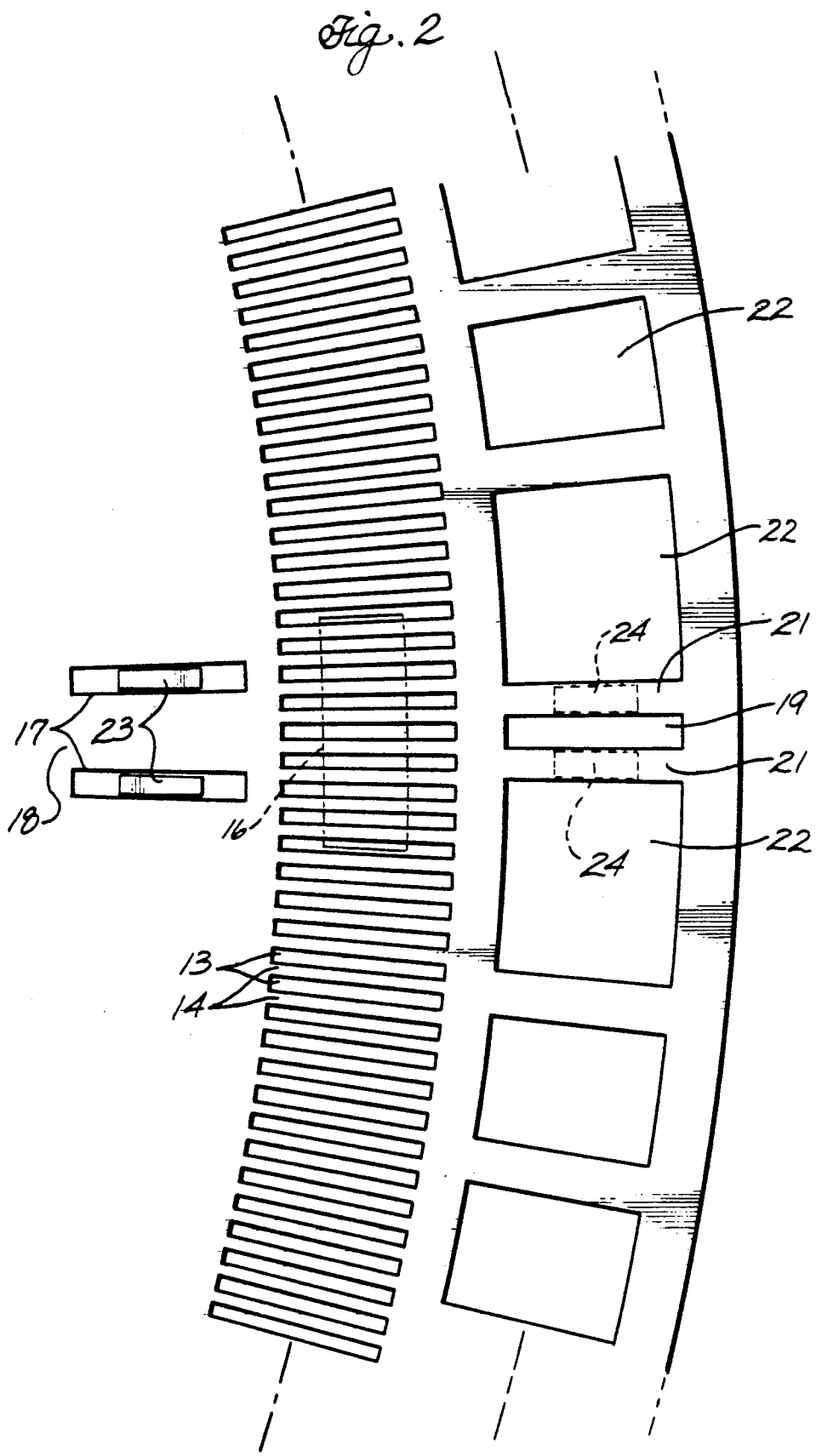
FIG. 2 is a fragmentary face view of the code wheel and the photodetectors of a shaft angle encoder constructed according to principles of this invention.

In a preferred embodiment as illustrated in FIG. 2 the code wheel has a circumferentially extending data track having alternating transparent windows 13 and opaque spokes 14. An array of photodiodes 16 is provided adjacent to the data track opposite one face of the code wheel. Light through the windows illuminates successive photodetectors as the wheel rotates to indicate changes in shaft angular position. Such arrays of photodiodes for providing output signals indicative of shaft rotation direction and angle are well-known.

Radially inwardly from the data track is an inner index track having a pair of windows 17 with an opaque spoke 18 therebetween.

Radially outwardly from the data track is an outer index track having a central window 19 with an opaque spoke 21 on each side. Beyond the opaque spoke in a circumferential direction are a plurality of larger lateral windows 22.

It should be understood that what is described as an inner track with a pair of windows and an outer track with a larger plurality of windows could be reversed. The inner track could have the pattern of windows in the outer track and vice versa. Thus, inner and outer are used herein for purposes of exposition of an exemplary embodiment and may in a broader sense be considered to be interchangeable.

It will also be recognized that although it is preferred to have the inner and outer index tracks straddle the data track, both of the index tracks could be spaced inwardly or outwardly of the data track. In such an embodiment the two index tracks might be spaced inwardly of the data track so that the circumference of the data track is maximized for enhanced resolution.

The array of windows in FIG. 2 is illustrated in the rotational position where an index pulse is produced. A pair of photodiodes 23 are aligned with the windows 17 in the inner data track. As second pair of photodiodes 24 are located beneath the opaque spokes 21 in the outer track. Each of the photodiodes is illustrated in FIG. 2 as if slightly narrower than the corresponding window or spoke. This is done for purposes of illustration and it should be understood that the respective photodiodes may be as wide as the corresponding window or spoke. The photodiodes are typically shorter in a radial direction than the windows in the index and data tracks to accommodate errors in concentricity without reducing light output significantly. Such features are conventional.

FIG. 3 illustrates a fragment of the wheel of FIG. 2 schematically to show a preferred arrangement of windows, spokes, and photodiodes in the two index tracks. The intervening data track has been deleted from this illustration.

In this preferred arrangement, the two windows 17 in the inner track each have a unit width w. The opaque spoke 18 between the windows is three units wide. Stated differently, the distance between the centerlines of the two inner windows is 4w. The central window 19 in the outer data track also has a width of one unit w. Each of the spokes 21 straddling the center window in the outer track has a width of one unit w. Thus, the distance between the adjacent lateral windows 22 in the outer track is 3w, the same as the distance between the two windows in the inner track. It will be apparent that the unit widths w are really angular widths rather than linear dimensions when on the circumferential tracks of a code wheel.

Each of the lateral windows commences in the same radial sector as the corresponding window in the inner track and extends away from the opaque spokes 21. Each of the lateral windows extends more than one unit width along the outer index track away from the opposite window, and preferably extends several units.

This much of the code wheel is completely symmetrical. Each track is itself symmetrical and is symmetrical with respect to the other tracks. The outer index track typically has large windows around the rest of the circumference of the code wheel. After departing from the region where the index pulse is generated, the pattern of windows may be asymmetrical since this does not affect the index pulse or side lobes of photocurrent. All that is needed in the balance of the index track is that the spokes between windows be narrow enough that at least one of the outer photodetectors is always illuminated.

Figure 4:
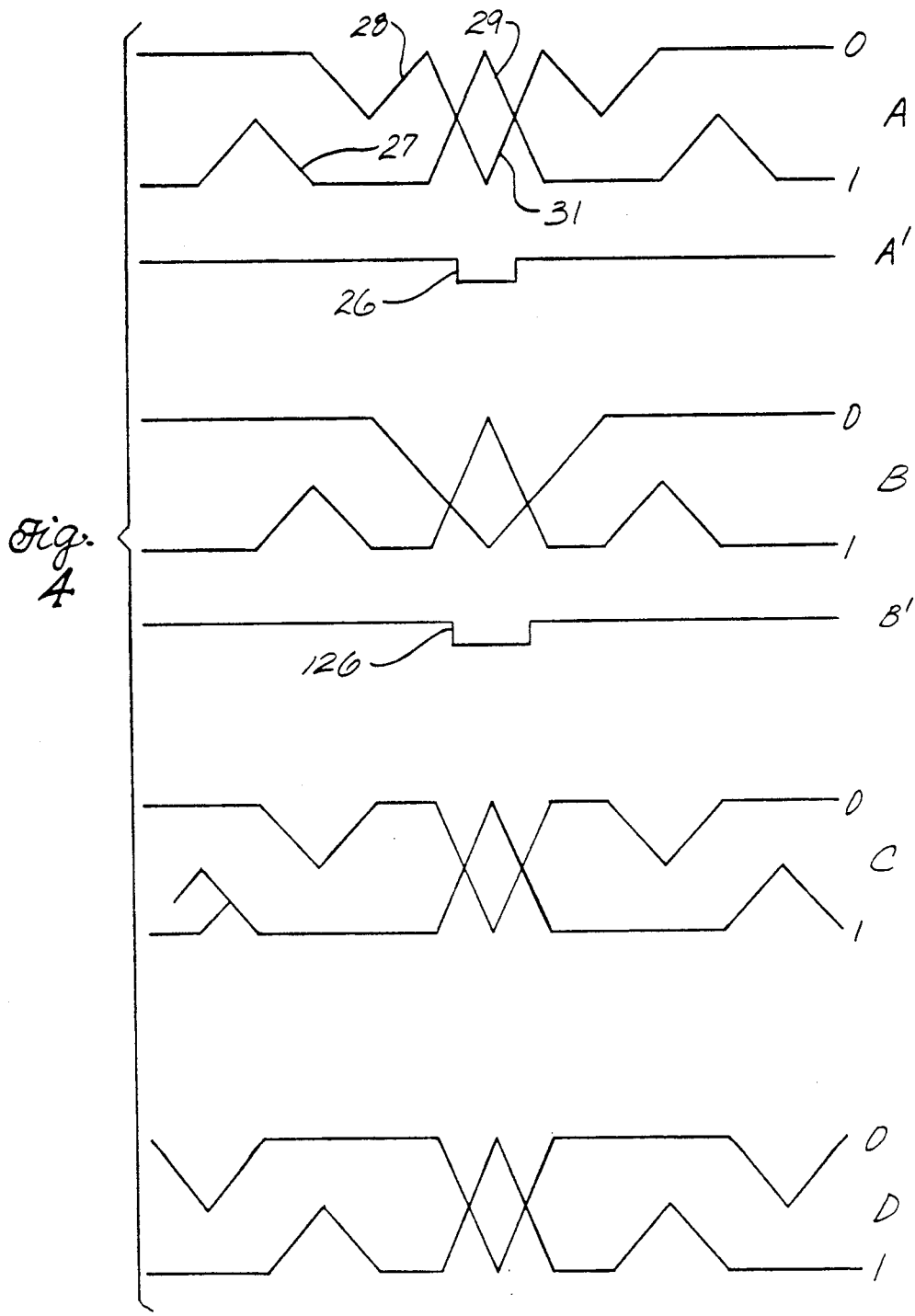
FIG. 4 comprises several wave forms indicative of operation of a shaft angle encoder.

The photocurrents from the photodiodes in the index tracks as the code wheel rotates are indicated schematically in waveforms A in FIG. 4. These waveforms are centered on the angular position of the code wheel which produces an index pulse 26 as illustrated in FIG. 4A'. The photocurrent from the pair of photodiodes (which are connected in parallel) in the outer index track is indicated by waveform 0 in FIG. 4. The waveform I indicates the photocurrent from the photodiodes for the inner track.

At the left edge of the waveforms the code wheel is in a position where the windows in the inner track are remote from the photodiodes and both photodiodes for the outer track are opposite one of the lateral windows 22 or the like remote from the center window 19. In such a position the outer photodiodes are illuminated and the inner photodiodes are not. Thus, there is a photocurrent from the two outer photodiodes and none from the inner photodiodes.

As the code wheel rotates clockwise, for example, in FIG. 3, one of the inner index track windows 17b passes in front of an inner photodiode 23a. This causes an increase in photocurrent from the inner photodiodes as indicated by a peak 27 in waveform curve I in FIG. 4A. As the disk continues to rotate, the inner photodiodes are again occulted by opaque portions of the inner track. The first spoke 21b of the outer index track next passes in front of the first photodiode 24a for the outer track causing a negative going peak 28 as the photocurrent decreases. The other outer photodiode 24b remains illuminated through a lateral window 22 so the photocurrent drops only halfway toward zero.

As rotation continues, the two inner windows 17a and 17b pass in front of the respective inner photodiodes 23a and 23b. This causes an increase in photocurrent from the two photodiodes as indicated by a peak 29 in the waveform I in FIG. 4A. This peak is twice as high as the first peak 28 since both photodiodes are illuminated. At the same time the outer spokes 21a and 21b occult the outer photodiodes 24a and 24b. This causes the photocurrent from the outer photodiodes to drop to zero as indicated by the negative going peak 31 in FIG. 4A.

This reversal of the magnitude of photocurrent from the two index tracks causes the push-pull circuit to generate an index pulse 26, the leading edge of which occurs when the inner track photocurrent exceeds the outer track photocurrent, and the trailing edge occurs when the outer track photocurrent is again larger than the inner track photocurrent. The pulse width is essentially the same width as the windows and spokes. In other words the duration of the pulse is the time it takes for the code wheel to rotate one unit width w.

Since the wheel is symmetrical in the circumferential direction, as it continues to rotate there are additional peaks in the photocurrent waveforms beyond the index pulse essentially identical to the peaks as the index pulse is approached.

In between the peak 28 where one of the outer photodiodes is occulted by the code wheel and the peak 31 where both outer diodes are occulted, the center window in the outer index track passes in front of the first photodiode 24a. This brings the photocurrent for the outer track back up to the current where both photodiodes are fully illuminated. This assures a sharp center peak 31.

It will also be noted that the side lobe peaks for the inner and outer tracks are not coincident. This is because, except at the index location, illumination of either photodetector for the inner track is offset from occulting of any photodetector for the outer track. Since they are offset from each other, false triggers are avoided.

Although it is preferred to have a center window of one unit width as hereinabove described, the width of that window can essentially be reduced to zero as illustrated in the alternative embodiment of FIG. 5. In this illustration the code wheel is in the index pulse position relative to the photodiodes. Structural features in FIG. 5 are indicated by reference numerals 100 larger than the comparable features in FIG. 3. Thus, for example, the inner track windows in FIG. 5 are numbered 117 to correlate with the inner track windows 17 in FIG. 3.

In this embodiment each of the inner track windows has a width w and the opaque area between the windows in the inner track is 2w. The opaque area between the lateral windows 122 in the outer track is 2w. The concomitant spacing of the photodiodes is similar, so that when the code wheel is in the index position the inner track photodiodes 123 are illuminated through the inner track windows and the outer track photodiodes 124 are occulted by the opaque area between the lateral windows.

This arrangement results in a waveform as illustrated in pattern B in FIG. 4. The width of the index pulse 126 due to this spacing of windows and photodetectors, is greater than the width of the index pulse 26 in the preferred embodiment, thereby diminishing the angular resolution obtainable by this embodiment of shaft angle encoder.

Figure 6:
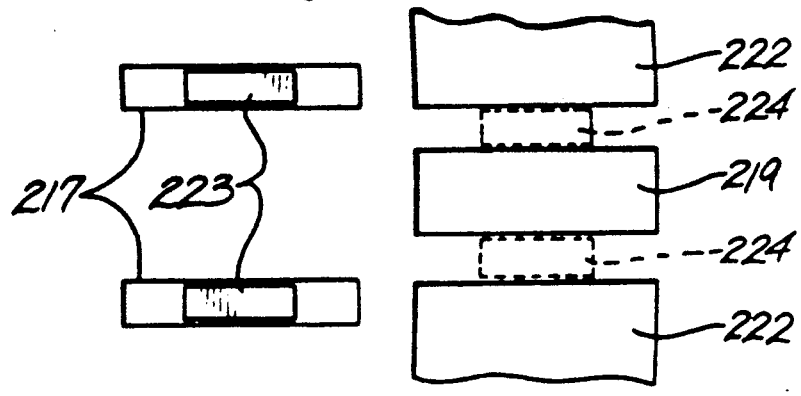
FIG. 6 indicates in a fragmentary schematic face view still another embodiment of shaft angle encoder constructed according to principles of this invention.

It is also feasible to employ a symmetrical code wheel for a shaft angle encoder where the central window 219 is wider than one unit, as illustrated in FIG. 6. In such an embodiment the inner track windows 217 are spaced further apart corresponding to the increased width of the center window. These inner track windows are in the same radial sectors as the beginning of the lateral windows 222 extending away from the spokes 221.

The waveform pattern for such an embodiment is illustrated in line C of FIG. 4. It resembles the waveform pattern for the embodiment of FIG. 3 with additional space between peaks. The index pulse width due to cross over of photocurrents from the inner and outer photodiodes, is the same as in the embodiment of FIG. 3.

It is preferred, however, to have the windows closer together as in the embodiment of FIG. 3 so that the lateral extent of the light source can be kept small. Further, as a general rule, the illumination nearer the center of the light source is better collimated than illumination from nearer the edges of the light source. Lack of collimation tends to broaden the edges of the waveform peaks and can degrade resolution. It is desirable to keep the circumferential extent small so that the concentricity requirement is of minimal stringency. Broader spacing of the windows tends to require closer tolerance on concentricity to obtain the desired accuracy and resolution. The arrangement of FIG. 3 provides the smallest angular extent of index windows for a minimum index pulse width.

Figure 7:
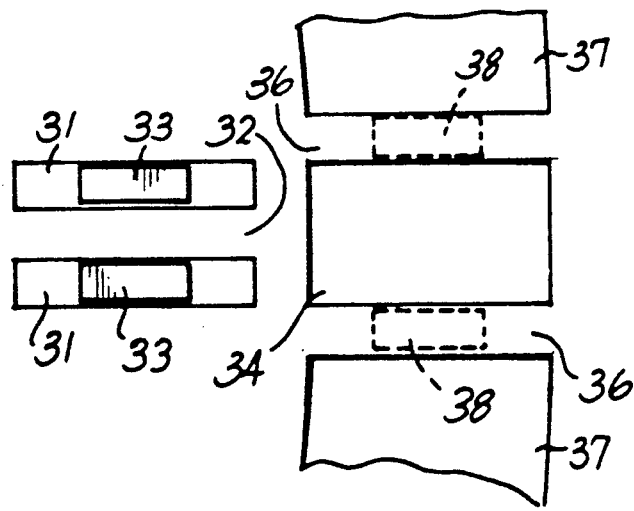
FIG. 7 indicates in a fragmentary schematic face view still another embodiment of shaft angle encoder which is, in effect, a negative of the embodiment of FIG. 3.

FIG. 7 illustrates another embodiment of symmetrical code wheel and photodetectors. In this embodiment the inner track has two windows of unit width w. Between the inner track windows there is a spoke 32 with one unit width. When the wheel is in the index position, a pair of inner track photodetectors 33 are illuminated through the windows. The outer track has a central window 34 with a width of 3w. On each side of the central window there is an opaque spoke 36 with one unit width. Beyond each spoke in the outer track there is a lateral window 37, each of which extends two or more units away from the spokes. A pair of outer track photodetectors 38 are located behind the spokes 36 when the wheel is in the index position.

The waveforms generated upon rotation of the code wheel in this embodiment are illustrated in part D of FIG. 4. It can be seen that the negative going side lobes 39 in the outer track photocurrent are not coincident with the positive going side lobes 41 in the inner track photocurrent.

It may be noticed that this embodiment of shaft angle encoder is, in effect, a negative of the embodiment illustrated in FIG. 3. The inner track in FIG. 7 has windows in the same positions as the spokes in the outer track in FIG. 3. The central spoke in FIG. 7 corresponds to the central window in the outer track in FIG. 3. Similarly, the windows and spokes in the outer track in FIG. 7 are the negative of the spokes and windows in the inner track in FIG. 3. The photodetectors are concomitantly rearranged. Either of these embodiments provides a minimum angular extent along the index tracks for a single narrow index pulse.

Although in the described embodiments the windows and spokes have substantially equal widths, some variation in the relative widths may be acceptable or even desirable. For example, it may be desirable to have somewhat wider windows on one of the index tracks than the other so that the magnitude of photocurrent from the respective photodiodes can be set to different values. If, for example, the illumination intensity at one track is somewhat low, larger windows and photodiodes may be used for enhancing photodiode current. Thus, the relative widths of various parts of the index tracks may differ by 30 percent or so and still be considered to be equal.

It will be noted from the wave patterns illustrated in FIG. 4 that each of the embodiments develops side lobes in the inner and outer tracks which occur at different locations. By avoiding coincidence of the side lobes despite the use of a symmetrical code wheel, false triggering of an apparent index pulse at an erroneous location can be avoided. Thus, the embodiments described and illustrated retain the advantages of a symmetrical code wheel which can be inverted, while still offsetting the peaks of photocurrent to prevent the side lobes on both tracks from being coincident.

Although limited embodiments of shaft angle encoder employing a symmetrical code wheel have been described and illustrated herein, it will be apparent that there may be many modifications and variations. Thus, for example, instead of having two windows on one of the tracks for enhancing photocurrent and providing a narrow index pulse, an additional pair of windows may be spaced apart on each side of the central pair for obtaining four times the photocurrent available for a single photodiode.

The code wheel has been described as if there were a single index pulse produced per revolution of the wheel. If desired several sets of index windows and spokes may be provided around the tracks for producing multiple index pulses.

As mentioned above, although referred to herein as a wheel, the encoder may be a linear position encoder. Many other modifications and variations will be apparent to those skilled in the art. It is, therefore, to be understood that within the scope of the appended claims the invention may be practiced otherwise than as specifically described.

What is claimed is:

1. A position encoder comprising:
   a source of illumination;
   at least one data photodetector;
   a movable code member between the source of illumination and the data photodetector including a data track of alternating windows and spokes for alternately illuminating and occulting the data photodetector upon movement of the code member;
   a first index track on the code member beside the data track and having a pair of windows spaced apart from each other by an opaque area, the windows being symmetrical in a longitudinal direction with respect to the data track;

a second index track on the code member beside the data track and having at least a pair of windows spaced apart from each other by an opaque area, the opaque area being symmetrical in a longitudinal direction with respect to the windows in the first index track;

a first pair of index photodetectors adjacent to the first index track and arranged to be illuminated by way of the windows in the first index track when the code member is in an index position; and a second pair of index photodetectors adjacent to the second index track and arranged to be occulted by the opaque area in the second index track when the code member is in the index position, the relative positions of the windows and opaque areas in the first and second index tracks being such that illumination of any photodetector for the first index track is offset from occulting of any photodetector for the second index track except in the index position.

2. A position encoder as recited in claim 1 wherein each window in the first index track has a unit width, the distance between the windows in the first index track is at least two units, and the width of the opaque area between the windows in the second index track is at least two units.

3. A position encoder as recited in claim 1 wherein the pair of windows in the first index track are more than two units apart from each other and the opaque area in the second index track comprises two spokes, each spoke being one unit wide, with a central window between the spokes.

4. A position encoder as recited in claim 3 wherein the central window has a width of one unit, and the windows in the first index track are spaced apart a distance of three units.

5. A position encoder as recited in claim 3 wherein the central window has a width of more than one unit, and the windows in the first index track are spaced apart a distance of more than three units.

6. A position encoder as recited in claim 1 wherein the pair of windows in the first index track are three units apart from each other and the opaque area in the second index track comprises two one unit wide spokes with a one unit wide window between the spokes.

7. A position encoder as recited in claim 6 wherein the index photodetectors for the second index track are occulted by the spokes when the index photodetectors for the first index track are illuminated by way of the windows in the first index track.

8. A position encoder as recited in claim 1 wherein each window in the first index track has a unit width, the distance between the windows in the first index track is one unit, and the opaque area in the second index track comprises two spokes, each spoke being one unit wide, with a three unit wide central window between the spokes.

9. A position encoder as recited in claim 8 wherein the index photodetectors for the second index track are occulted by the spokes when the index photodetectors for the first index track are illuminated by way of the windows in the first index track.

10. A position encoder as recited in claim 1 wherein the code member comprises a wheel with a circumferentially extending data track, the first index track is concentrically within the data track and the second index track is concentrically outside of the data track.

11. A position encoder as recited in claim 1 wherein the first index track is on one side of the data track and the second index track is on the other side of the data track.

12. A shaft angle encoder having a symmetrical code wheel comprising:

a source of illumination;

at least one data photodetector;

a rotatable code wheel between the source of illumination and the data photodetector including a circumferential data track of alternating windows and spokes for alternately illuminating and occulting the data photodetector upon rotation of the code wheel;

a first index track on the code wheel concentric with the data track and having a pair of windows each having a width of one unit, the windows being symmetrical in a circumferential direction with respect to the data track;

an opaque area between the windows in the first index track having a width of three units;

a second index track on the code wheel concentric with the data track and having a pair of lateral windows spaced apart from each other, each lateral window beginning in the same radial sector as the windows in the first index track and extending away from each other a distance more than two units;

a central window between the lateral windows in the second index track, the central window having a width of one unit;

an opaque spoke between the central window and each of the lateral windows in the second index track, each spoke having a width of one unit;

a first pair of index photodetectors adjacent to the first index track and arranged to be illuminated by way of the windows in the first index track when the code wheel is in an index position; and a second pair of index photodetectors adjacent to the second index track and arranged to be occulted by the spokes in the second index track when the code wheel is in the index position.

13. A shaft angle encoder as recited in claim 9 wherein the first index track is concentrically within the data track and the second index track is concentrically outside of the data track.

14. A shaft angle encoder having a symmetrical code wheel comprising:

a source of illumination;

at least one data photodetector;

a rotatable code wheel between the source of illumination and the data photodetector including a circumferential data track of alternating windows and spokes for alternately illuminating and occulting the data photodetector upon rotation of the code wheel;

a first index track on the code wheel concentric with the data track and having a pair of windows each having a width of one unit, the windows being symmetrical in a circumferential direction with respect to the data track;

an opaque area between the windows in the first index track having a width of one unit;

a second index track on the code wheel concentric with the data track and having a pair of lateral windows spaced apart from each other, each lateral window extending away from each other a distance more than two units;

a central window between the lateral windows in the second index track, the central window having a width of three units;

an opaque spoke between the central window and each of the lateral windows in the second index track, each spoke having a width of one unit;

a first pair of index photodetectors adjacent to the first index track and arranged to be illuminated by way of the windows in the first index track when the code wheel is in an index position; and a second pair of index photodetectors adjacent to the second index track and arranged to be occulted by the spokes in the second index track when the code wheel is in the index position.

15. A shaft angle encoder as recited in claim 14 wherein the first index track is concentrically within the data track and the second index track is concentrically outside of the data track.

16. A shaft angle encoder comprising:

a light source;

a photodetector;

a code wheel between the light source and the photodetector with a circumferentially extending data track of alternating opaque spokes and transparent windows for determining shaft angle or position, the code wheel further comprising:

an inner index track on the code wheel concentrically inside the data track;

an outer index track on the code wheel concentrically outside the data track;

a pair of windows of unit width spaced apart three unit widths around the inner index track;

a center window in the outer index track having a unit width and centered on a radial line midway between the pair of windows on the inner index track;

a pair of spokes on the outer index track, one spoke of one unit width being on each side of the center window; and a lateral window on the outer index track adjacent to each spoke and extending at least two unit widths along the outer index track;

a pair of photodetectors of unit width spaced apart three unit widths adjacent to the inner index track; and a pair of photodetectors of unit width spaced apart one unit width adjacent to the outer index track and symmetrically located with respect to the photodetectors adjacent to in the inner index track.

17. A symmetrical code member for a position encoder comprising:

a data track having a plurality of alternating windows and spokes;

a first index track;

a second index track, the index tracks each being symmetrical in a direction along the respective index track, being symmetrical in a longitudinal direction with respect to each other, and being symmetrical in a longitudinal direction with respect to the data track;

a pair of windows of unit width in the first index track;

a spoke between the two windows having a width of at least two units;

a pair of windows in the second index track in the same radial sectors as the windows in the first index track and extending more than a unit width along the track away from each other; and an opaque area at least two units wide between the windows in the second index track.

18. A code member as recited in claim 17 wherein the pair of windows in the first index track are more than two units apart from each other and the opaque area in the second index track comprises two one unit wide spokes with a window between the spokes.

19. A code member as recited in claim 17 wherein the pair of windows in the first index track are three units apart from each other and the opaque area in the second index track comprises two one unit wide spokes with a one unit wide window between the spokes.

20. A code member as recited in claim 17 wherein the member is a wheel and the data track extends circumferentially around the wheel, the first index track is concentrically on one side of the data track, and the second index track is concentrically on the other side of the data track.

21. A code member as recited in claim 17 wherein the first index track is on one side of the data track and the second index track is on the other side of the index track.

22. A symmetrical code member for a position encoder comprising:

a data track having a plurality of alternating windows and spokes;

a first index track;

a second index track, the index tracks each being symmetrical in a longitudinal direction, being symmetrical in a longitudinal direction with respect to each other, and being symmetrical in a longitudinal direction with respect to the data track;

a pair of windows of unit width in the first index track;

a spoke between the two windows having a width of one unit;

a central window in the second index track in the same radial sectors as the windows in the first index track and extending more than a unit width along the track;

an opaque spoke one unit wide on each side of the central window in the second index track; and a lateral window extending away from each spoke in the second index track.

23. A code member as recited in claim 22 in the form of a wheel with a circumferentially extending data track, wherein the first index track is concentrically within the data track and the second index track is concentrically outside of the data track.

24. A code member as recited in claim 22 wherein the first index track is on one side of the data track and the second index track is on the other side of the index track.

* * * * *